(12) United States Patent
Gasperi

(10) Patent No.: US 7,671,606 B2
(45) Date of Patent: *Mar. 2, 2010

(54) PORTABLE LINE IMPEDANCE MEASUREMENT METHOD AND SYSTEM

(75) Inventor: Michael L. Gasperi, Racine, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 260 days.

This patent is subject to a terminal disclaimer.

(21) Appl. No.: 11/796,803

(22) Filed: Apr. 30, 2007

(65) Prior Publication Data

US 2008/0265912 A1 Oct. 30, 2008

(51) Int. Cl.
G01R 27/28 (2006.01)
G01R 27/08 (2006.01)

(52) U.S. Cl. .................... 324/652; 324/691

(58) Field of Classification Search ............ 324/652, 324/691
See application file for complete search history.

(56) References Cited

U.S. PATENT DOCUMENTS

| | | | | |
|---|---|---|---|---|
| 3,904,859 A | * | 9/1975 | Poncelet | 324/649 |
| 5,587,662 A | * | 12/1996 | Kelley et al. | 324/713 |
| 5,631,569 A | * | 5/1997 | Moore et al. | 324/713 |
| 6,397,156 B1 | * | 5/2002 | Bachmann et al. | 702/65 |
| 6,515,485 B1 | * | 2/2003 | Bullock et al. | 324/601 |
| 6,713,998 B2 | * | 3/2004 | Stanimirov et al. | 324/117 R |
| 7,164,275 B2 | * | 1/2007 | Gasperi | 324/652 |
| 7,200,502 B2 | * | 4/2007 | Gasperi et al. | 324/691 |
| 2006/0229831 A1 | * | 10/2006 | Gasperi et al. | 702/60 |
| 2006/0241881 A1 | * | 10/2006 | Gasperi et al. | 702/62 |

* cited by examiner

Primary Examiner—Timothy J Dole
(74) Attorney, Agent, or Firm—Fletcher Yoder LLP; Alexander R. Kuszewski

(57) ABSTRACT

A technique is disclosed for determining capacitive, inductive, and resistive components of power line impedance via a portable line impedance measurement system. The measurement system includes a circuit that switches a burden resistor between power line conductors to cause a droop in a voltage waveform. The voltage waveform is sampled prior to inclusion of the resistor in the circuit, as well as after to identify the droop. The short circuit between the power lines is then removed by opening the circuit and a first effective capacitance in the test circuitry causes a resonant ring due to the inductive component of the power line impedance. The process is repeated a second time with a second effective load capacitance enabled in the test circuitry to cause a second resonant ring. Based upon the frequency of the rings and the voltage measurements, the individual impedance components of power line impedance can be computed.

14 Claims, 11 Drawing Sheets

PORTABLE LINE IMPEDANCE MEASUREMENT METHOD AND SYSTEM

BACKGROUND

The present invention relates generally to the field of monitors and measurement devices for electrical power. More particularly, embodiments of the present invention relate to techniques for determining impedance parameters of electrical power, particularly power distributed via a power distribution grid.

A wide range of applications exists for power monitors and devices capable of determining parameters of electrical power. For example, in many applications unwanted conditions can arise in loads, distribution equipment and lines, the severity of which is a function of the line impedance. For example, the line impedance is a precursor to calculating short circuit current, arc current, available energy, and other important features of electrical power. Because these currents and energies can flow or be released during a fault condition or other unwanted, or even desired situations, knowing the power line impedance is of considerable importance.

Various methods exist in the art for calculating or attempting to determine power line impedance. For example, impedance can be computed based upon nameplate information on certain equipment, in addition to knowledge of the physical and electrical characteristics of distribution components. Transformers, for example, typically carry nameplate information regarding impedance as a percentage value. Knowledge of the size and length of electrical conductors, and the characteristics of other intermediate components between the transformer and a load can be used to calculate or estimate the impedance at particular points in a system. However, such techniques are highly imprecise, and rely upon some degree of estimation as to the actual characteristics of the components and transmission lines.

Techniques have also been developed for directly measuring impedance of power lines. Such techniques have permitted some degree of knowledge of the power line impedance, but are still somewhat imprecise or incomplete. For example, known techniques do not typically permit measurement of the capacitive, inductive, and resistive components of the power line impedance. While one of these components may generally dominate the impedance measurement, all of these components are important for determining the actual characteristics of the current and energy that can be released by the power line, particularly during transient periods such as faults. This is especially relevant when the line impedance includes power factor correction capacitors or other parasitic capacitances that may significantly affect the line impedance reading if not properly determined or compensated for.

Therefore, there is a need in the art for improved techniques for measuring and determining impedance of power sources. There is a particular need for a technique and system that would permit accurate measurement of power line impedance, including capacitance, inductive, and resistive components thereof, or at least compensation for certain of these.

BRIEF DESCRIPTION

The present invention provides novel techniques for determining power line impedance values designed to respond to such needs. The technique can be used in a wide range of settings, such as in available energy determinations, identification of short circuit currents and arc currents, for identifying possible problems with under-loading of power lines, and so forth. The techniques can be used on single-phase and three-phase applications with little modification. Moreover, the technique can be implemented in permanent (i.e., hard-wired) circuitry, or can be part of mobile or even hand-held system used to identify impedance only on a periodic or sporadic basis, such as during system commissioning. Still further, the technique may be implemented through the use of analog circuitry or digital circuitry, such as by sampling the desired input data and subsequent processing to identify the desired impedance parameters.

In accordance with certain aspects of the present techniques, a burden or drain in placed on a power line, the impedance of which is to be measured. The drain causes a droop in the voltage waveform through the power line that can be measured. Following this droop, the drain or burden is removed from the circuit and a first effective capacitor causes, in conjunction with the inductive component of the power line impedance, a first resonant ring. The period or the frequency of the first ring is identified. The burden or drain is then reapplied to the power line causing a second droop in the voltage waveform. Following this second droop, the drain or burden is removed from the circuit and a second effective capacitance causes, in conjunction with the inductive component of the power line impedance, a second resonant ring. The period or the frequency of the second ring can be identified, and used to in conjunction with the period of the first ring to determine the inductive and the capacitive components of the power line impedance. Further, the resistive component can be identified from the voltage droop, and other parameters of the circuitry. The resulting determinations can then be used for subsequent processing or estimations, such as available energy, short circuit current, arc current, and so forth.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
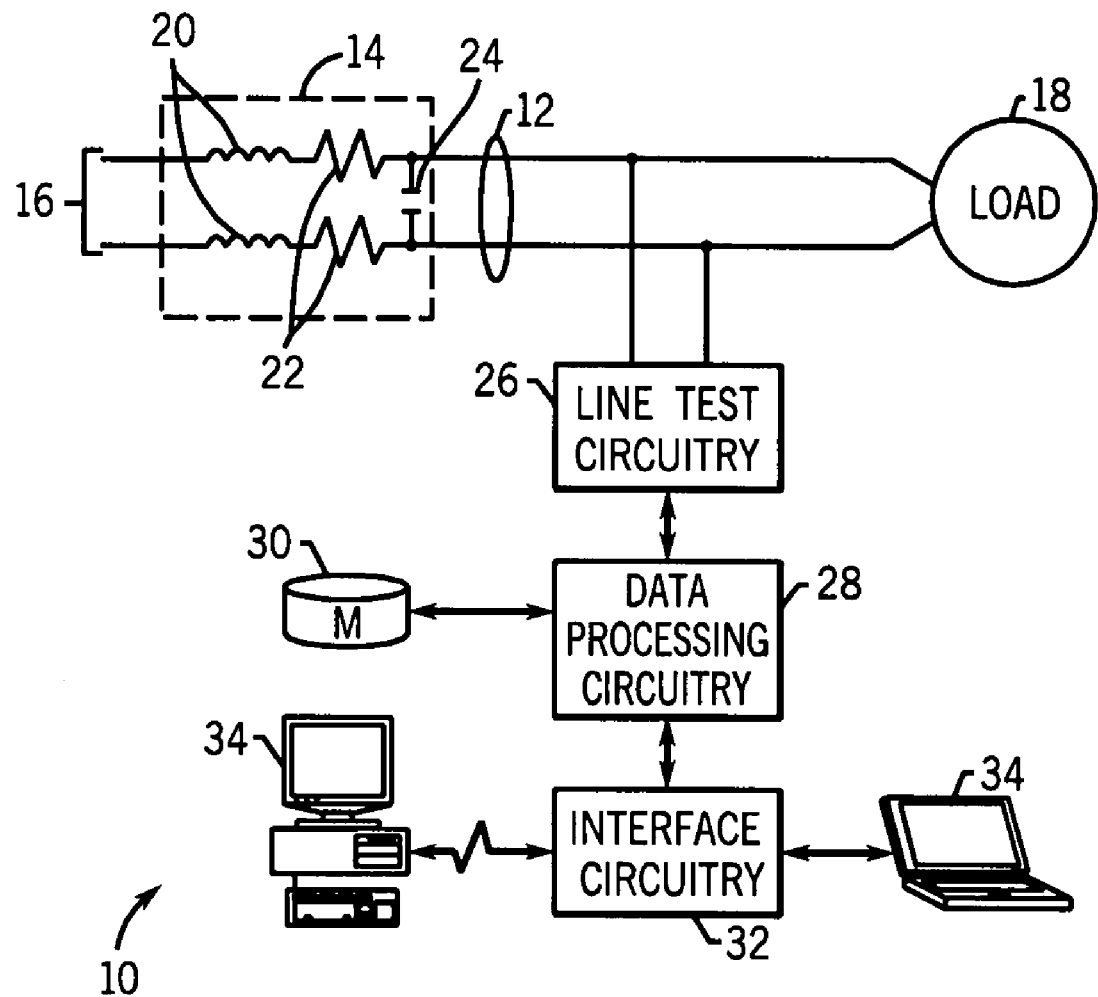
FIG. 1 is a diagrammatical representation of a power line impedance measurement system in accordance with aspects of the present technique, applied to a single-phase application.

Turning now to the drawings, and referring first to FIG. 1, an impedance monitoring system is illustrated and designated generally by the reference numeral 10. The impedance monitoring system is illustrated in a single-phase application. That is, the system is illustrated for identifying the impedance of a single-phase power source. However, as discussed in greater detail below, the system may be easily adapted for identifying impedance parameters of three-phase power lines and sources as well.

Impedance monitoring system 10 is illustrated as coupled to a pair of power supply lines 12. Power supply lines 12, and any upstream circuitry, such as transformers, connectors, and so forth are considered to have a net impedance illustrated by equivalent circuitry in box 14 of FIG. 1. The impedance 14 is, for the present purposes, considered to be a collective or cumulative impedance of the entire power supply network, represented generally by reference numeral 16 to a point between a power supply grid and a load 18. As discussed in greater detail below, the present system provides the potential for determining impedance by measurement at or adjacent to a load 18. In practical applications, the monitoring system 10 may be coupled at any point along the power supply lines.

Impedance 14 is generally considered to include inductive components 20, resistive components 22, and capacitive components 24. The inductive and resistive components will be present in both supply lines, although for the present purposes these components may be grouped or accumulated into a net inductive component and a net resistive component as discussed in greater detail below. Additionally, impedance may include parasitic capacitance component 24. Parasitic capacitance is generally defined as capacitance that is not taken into account when considering ideal circuit elements and may take the form of power factor correction capacitors, as well as any other capacitances that are otherwise unaccounted for. This capacitance may have detrimental effects if not determined or accounted for because it can result in underestimating the true line impedance, and thus, the true available energy.

System 10 includes line test circuitry 26 for perturbing the voltage waveform transmitted through the power lines and for making measurements of the voltage waveform. The line test circuitry 26 is coupled to and works in conjunction with data processing circuitry 28. As discussed in greater detail below, the line test circuitry 26 and the data processing circuitry 28 may, in certain applications, be analog circuitry, or at least partially comprise analog circuitry. In a present embodiment, however, the line test circuitry and the data processing circuitry digitally sample voltage measurements and store the sampled data in a memory 30. The stored sampled voltage measurements are then analyzed to determine parameters of the voltage waveform that are used to compute the values of the inductive, resistive, and capacitive components of the line impedance, or to compensate for certain parasitic capacitance in determining or estimating the power line impedance. Additionally, the data processing circuitry 28 and memory 30 may be any suitable form. For example, both of these components may be included in a general purpose or application-specific computer. Moreover, the circuitry may be local and permanently installed with an application, or may be portable circuitry, such as in hand-held devices. Similarly, the data processing circuitry and memory may be entirely remote from the line test circuitry so as to provide the desired analysis without necessarily displacing equipment or operators to the test site.

The data processing circuitry 28 may be accessed and interfaced with operator workstations by interface circuitry 32. The interface circuitry 32 may include any suitable interfaces, such as Ethernet cards and interfaces, Internet access hardware and software, or other network interfaces. In appropriate situations, the interface circuitry 32 may allow for interfacing with the data processing circuitry by conventional serial port communication, and so forth. As illustrated in FIG. 1, various operator interfaces may be envisioned, including laptop computers, computer workstations, and so forth, as represented generally by reference numeral 34 in FIG. 1.

Figure 2A:
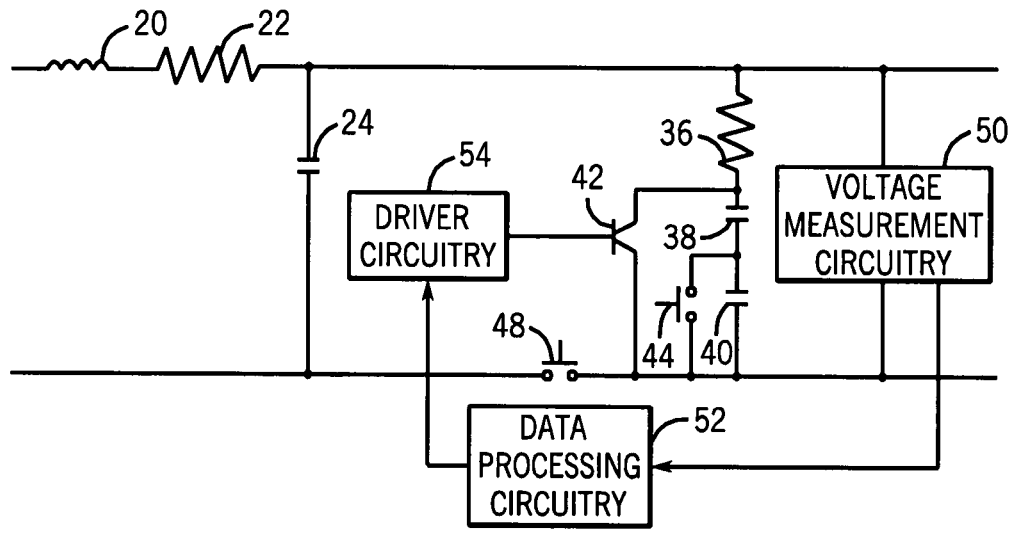
FIG. 2A is a somewhat more detailed view of certain of the circuitry of the power line impedance measurement system of FIG. 1, illustrating a configuration wherein first and second capacitors may be connected in series to cause respective first and second resonant rings in the voltage line.

The line test circuitry 26 is illustrated in somewhat greater detail in FIG. 2A, along with the physical relationship between the portions of the circuitry. As noted above, the collective or cumulative impedance in the power lines may be diagrammatically represented as single inductive component 20, resistive component 22, and parasitic capacitance component 24. The line test circuitry includes a resistor 36 which may be connected in series with a first capacitor 38 and/or a second capacitor 40. The resistor is connected to the capacitor (s) via a solid state switch 42. Additionally, a second switch 44 further enables the first capacitor to be connected in series with second capacitor 40. In other words, second switch 44 enables for a first effective capacitance or a second effective capacitance to be placed in series with resistor 36 via opening or closing of switch 44. For example, when switch 44 is open, the effective capacitance is a function of both the first and second capacitors and may be determined via a standard equation for capacitors in series. Likewise, when switch 44 is closed, the effective capacitance is only a function of the first capacitor because the second capacitor is short circuited via the closing of switch 44. Similarly, solid state switch 42 enables first capacitor 38 and second capacitor 44 to be completely bypassed, creating a short circuit between the power lines during test sequences as summarized below.

Where desired, an enable switch, represented generally at reference numeral 48, may also be provided in series with these components. Switch 48 enables an operator to perform a test sequence, and to remove the components from the power line circuit during normal operation. Thus, switch 48 may permit any leakage current between the power lines to be avoided.

Voltage measurement circuitry 50 is provided that spans the power line conductors. The voltage measurement circuitry 50 may include any suitable voltage measurement configurations, and is particularly adapted to sample voltage across the power lines and to provide values representative of the sampled voltage to data processing circuitry 52. The data processing circuitry 52 includes the data processing circuitry 28 and the memory 30 illustrated in FIG. 1, along with any appropriate programming for carrying out the functions, measurements, and analyses described below. To initiate and advance the test sequences for measuring the parameters of the power line impedance, the data processing circuitry 52 is coupled to driver circuitry 54 which may provide signals to solid switch state 42, switch 44, and/or switch 48 to open and close the switches as described in greater detail below. Additionally, some or all of these switches may be operated manually.

Although the present invention is not intended to be limited to any particular circuit configuration or component values, the following component values have been found effective in identifying impedance parameters in a 60 Hz power source. Resistor 36 was implemented as a 1Ω resistor, while the value of capacitors 38,40 were 20 μF. The switch 42 was selected as an insulated gate bipolar transistor (IGBT) having a voltage rating of 1200V and amperage rating of 400 A. It is advisable that the switch 42 be overrated to some degree to permit peaks in the voltage waveform that may result from opening and closing of the switch, and particularly the affects of the resonant ring following closure.

Figure 2B:
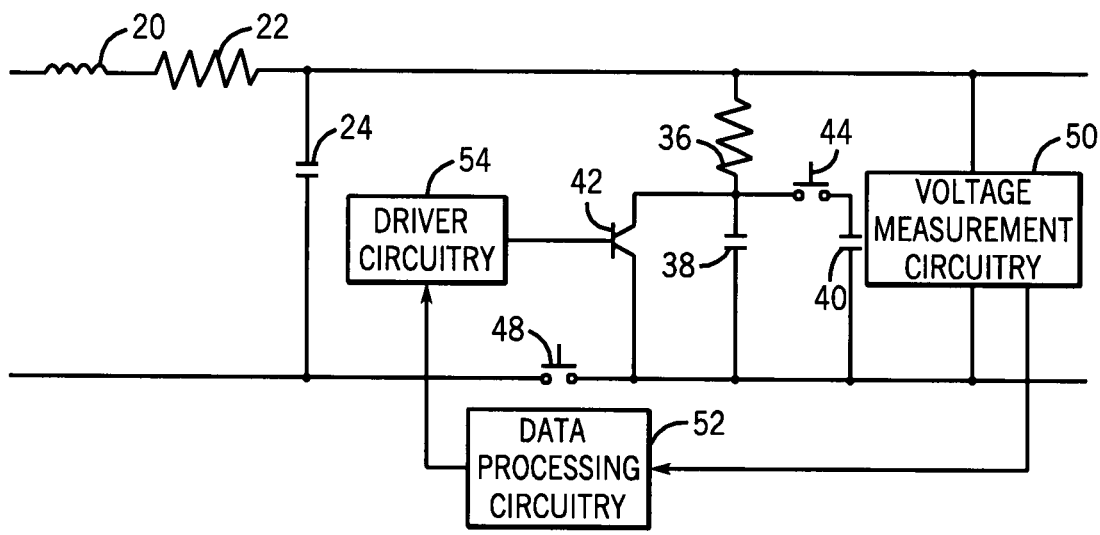
FIG. 2B is a somewhat more detailed view of certain of the circuitry of the power line impedance measurement system of FIG. 1, illustrating a configuration wherein first and second capacitors may be connected in parallel to cause respective first and second resonant rings in the voltage line.
Figure 2C:
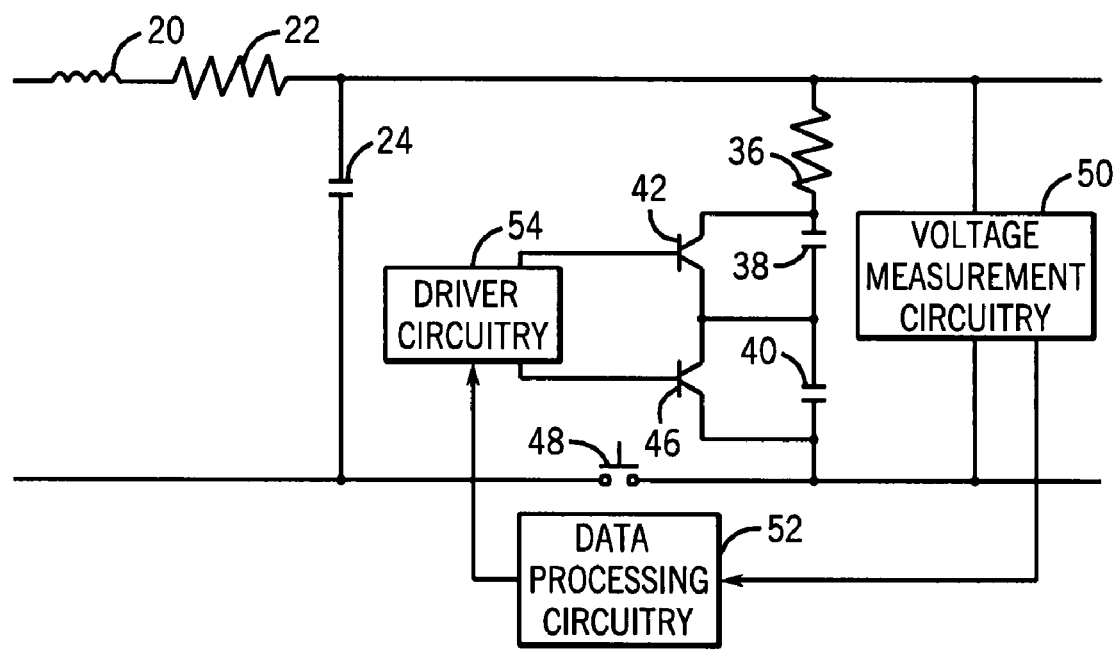
FIG. 2C is a somewhat more detailed view of certain of the circuitry of the power line impedance measurement system of FIG. 1, illustrating an alternate configuration for placing the first and second capacitors in series to cause the first and second resonant rings in the voltage line.

FIGS. 2B and 2C illustrate alternate embodiments of line test circuitry 26 illustrated in FIG. 2A, along with the physical relationship between the portions of the circuitry. As noted in the discussion relating to FIG. 2A, the collective or cumulative impedance in the power lines may be diagrammatically represented as single inductive component 20, resistive component 22, and parasitic capacitance component 24. Similarly, the line test circuitry includes resistor 36 which may be connected in series with a first capacitor 38 and/or a second capacitor 40 via opening solid state switch 42. However, in this configuration second switch 44 enables first capacitor 38 to be connected in parallel with second capacitor 40. Thus, the first and second effective capacitances may be different from those resulting from operation of the circuitry illustrated in FIG. 2A, and may be determined via a standard equation for capacitors in parallel. In short, this embodiment provides another option for creating different effective capacitances that may be connected to the resistor and placed between the line and different electrical potentials. Further, the embodiments illustrated in FIGS. 2A and 2B may even be combined to provide additional options for enabling more than two effective capacitances. In fact, either of these embodiments may include additional capacitors and additional switches for enabling multiple effective capacitances.

FIG. 2C illustrates a third configuration that provides a second solid state switch 46 that enables first capacitor 38 to be connected in series with second capacitor 40. Again, solid state switch 46 enables first and second effective capacitances to be placed in series with resistor 36 via opening or closing of the switch. As before, the embodiments illustrated in FIGS. 2B and 2C enable solid state switch 42, second switch 44, or solid state switch 46 to bypass first capacitor 38 and second capacitor 40 by creating a short circuit between the power lines during a test sequences as summarized below.

Figure 3:
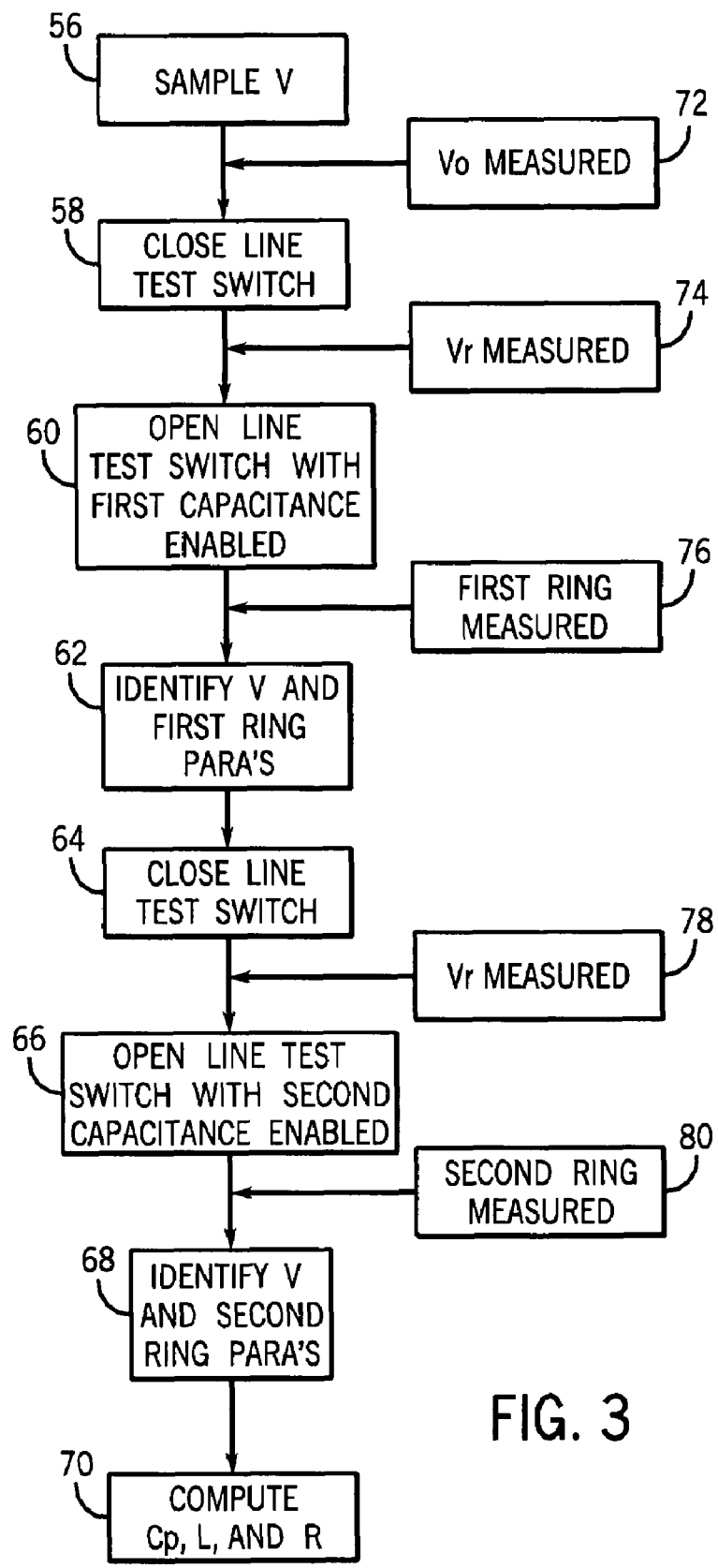
FIG. 3 is a diagrammatical representation of certain exemplary steps in identifying power line impedance values based upon the circuitry of FIGS. 1-2C.

Exemplary logic for a particular test sequence implemented by the circuitry of FIGS. 2A-2C is illustrated diagrammatically in FIG. 3. As noted above, voltage measurement circuitry 50 first begins to sample voltage across the power lines as indicated at reference numeral 56. At a desired point in the waveform, switch 42 is closed, as indicated at step 58 in FIG. 3. Closure of switch 42 (with switch 48 closed to enable the circuitry, where such a switch is provided) causes a short circuit between the power lines, by routing current around capacitor 38. The low value of the resistor 36 acts as a drain or burden, causing a droop in the voltage waveform peak as described in greater detail below. Subsequently, switch 42 is opened, as indicated at reference numeral 60, with switch 44 closed in FIG. 2A and open in FIG. 2B. Opening of switch 42 then causes a first resonant ring between the inductive component 20 of the line impedance and capacitor 38. This resonant ring is dampened by the resistive component 22 of the power line impedance and by the resistor 36. The relevant ring parameters are then identified, as indicated at reference numeral 62.

The process is then generally repeated to identify parameters of a second resonant ring when a second effective capacitance is placed between the line and the electrical potential. Specifically, at a desired point in the waveform, switch 42 is closed for a second time, as indicated at step 64. Closure of switch 42 causes a short circuit between the power lines, by routing current around first capacitor 38 and second capacitor 40. As before, the low value of the resistor 36 acts as a drain or burden, causing a droop in the voltage waveform peak as described in greater detail below. Subsequently, switch 42 is opened, as indicated at reference numeral 60, with switch 44 open in FIG. 2A and closed in FIG. 2B. Opening of switch 42 causes a second resonant ring between the inductive component 20 of the line impedance and capacitor 38 and 40. This resonant ring is dampened by the resistive component 22 of the power line impedance and by the resistor 36. The relevant ring parameters are then identified for this second resonant ring, as indicated at reference numeral 68.

With the voltage continuously being measured (i.e., sampled) by the voltage measurement circuitry 50, measurements are stored in the memory circuitry for later analysis. In a present implementation, with digital sampling of the voltage waveform, at steps 72, 74, 76, 78, and 80 in FIG. 3, the voltage and ring parameters used to identify the inductive and resistive components of the line impedance may be determined as indicated at step 62 and 68. At step 70 the capacitive, inductive, and resistive components of the line impedance are then computed based upon these identified values.

Thus, with steps 56 through 70 being carried out, the system response is measured continuously through the sampled data. These measurements are summarized at step 72 in FIG. 3, where a value of the voltage with the line test circuitry open is determined, and steps 74 and 80 where a voltage across the power lines with the resistor 36 and capacitors in short circuit between the power lines is determined. Steps 76 and 80 represents measurement of the ring parameters used in the subsequent computations.

The calculations made of the inductive and resistive components of the power line impedance in accordance with the present techniques may be based upon the following computational scheme. As will be appreciated by those skilled in the art, the inductive-capacitive (LC) resonant frequency established upon opening of switch 42, with little or no damping in the circuit may be expressed by the relationship:

$$2\pi f = \frac{1}{\sqrt{LCload}} \qquad \text{Equation 1}$$

where f is the resonant frequency of the LC circuit, L is the value of the inductive component of the line impedance, and the parameter Cload is the value of the effective capacitance of the circuit which may include both known and parasitic capacitance values.

It will be noted, however, the resistor 36, particularly where a very low value of resistance is chosen, will provide significant damping to the resonant ring. Indeed, as will be appreciated by those skilled in the art, the value of the resistor 36 chosen strikes a balance between the desire to adequately sample a voltage droop caused by the drain represented by the resistor, while providing a significantly long (i.e., less damped) resonant ring to permit measurement of the ring period or frequency. Considering such damping, the relationship indicated in Equation 1 becomes described by the following relationship:

$$2\pi f = \sqrt{\frac{1}{2LCload} - \left(\frac{2R + Rload}{4L}\right)^2} \qquad \text{Equation 2}$$

where the value R represents the value of the resistive component of the line impedance, and the value Rload represents the rating of the resistor 36 discussed above.

Recognizing that R is small compared to the load resistance, that is R is much less than Rload, Equation 2 may be solved for the value of the line inductance L, and expressed in terms only of the values of Cload, Rload and the frequency f:

$$L = \frac{\frac{1}{Cload} + \sqrt{\frac{1}{Cload^2} - (2\pi f)^2 Rload^2}}{4(2\pi f)^2}. \qquad \text{Equation 3}$$

Because the presence of parasitic capacitance tends to act as a parallel capacitance to the capacitors of the current system, that is capacitors 38 and 40, Cload may be re-written by Equation 4.

$$Cload = C + Cp \qquad \text{Equation 4}$$

where Cp is parasitic capacitance 24 of the circuit, and C is the effective capacitance of capacitors 38 and 40 determined by whether that are connected in series, parallel, or individually. Substituting Equation 4 into Equation 3 provides:

$$L = \frac{\frac{1}{C+Cp} + \sqrt{\frac{1}{(C+Cp)^2} - (2\pi f)^2 Rload^2}}{2(2\pi f)^2}. \qquad \text{Equation 5}$$

To complete the system of equations desired for calculating the inductive and resistive components of the line impedance, in accordance with the present techniques, the voltage sag or droop caused by closure of switch 42 and the presence of the drain or burden resistor 36 may be expressed in terms of the voltage sampled across the power lines with the line test circuitry open, indicated by the quantity Vo, and the voltage across the power lines with the circuitry closed, Vr, that is, with the resistor 36 in a series across the power lines as follows:

$$Vr = Vo \frac{Rload}{j377L + R + Rload} \qquad \text{Equation 6}$$

where Vo and Vr are either the peak or RMS AC voltage values. It should be noted that the value 377 in Equation 4 (and in the subsequent equations below) is derived from the product of $2\pi$ and a line frequency of 60 Hz. As will be appreciated by those skilled in the art, the equations will differ for other line frequencies, although the principles for computation of the line impedance parameters will remain unchanged. Equation 6 may be rewritten as follows:

$$Vr = Vo \frac{Rload}{\sqrt{(377L)^2 + (R + Rload)^2}}. \qquad \text{Equation 7}$$

It may be noted that Equation 5 may be solved in terms of the value of the resistive component of the line impedance, R, as follows:

$$R = \sqrt{\frac{(Vo\ Rload)^2 - (Vr377L)^2}{Vr^2}} - Rload. \qquad \text{Equation 8}$$

Thus, based upon four measured values alone, the values of the parasitic capacitance of the system Cp, inductive component of the line impedance, L, and the resistive component of the power line impedance, R, may be computed by Equations 5 and 8. The measured values, in accordance with the present technique, are the values of Vo, Vr, and two frequency f measurements, or the period, which will be appreciated by those skilled in the art, is the inverse of this frequency value.

Further, as discussed above, when parasitic or other capacitances are present, the resonant frequency is altered and can no longer be used to directly calculate the line inductance via Equation 3 because Cload will be underestimated. In other words, if parasitic capacitance is not present, the frequency of the resonance will only shift by the difference in the load capacitance (i.e., capacitor 38 and 40). Therefore, the presence of a parasitic capacitance may be detected by comparing the shift in the resonant frequencies given two known load capacitances. Additionally, if the parasitic capacitance is not too large, when compared to the load capacitance, the parasitic capacitance may be determined by iteratively solving Equation 5. That is, two independent equations may be written given the two measured frequencies, two effective capacitances (C) and the known resistance (R). Further, parasitic capacitance (Cp) and the inductive component (L) may be determined by using these two independent equations to iteratively solve for L by substituting values of Cp until the calculated values for L converge.

In one embodiment of the present invention, a program is used to simultaneously solve these two equations. An exemplary embodiment of such a program is available from National Instruments located in Austin, Tex., and may be identified by the trade name LabVIEW. The program uses an algorithm that includes a while loop to enable the system to input the values for Rload, C, and the frequencies determined in the process described above. Next, a scaled version of the loop index is used and an estimate of Cp is added to the values of C in both independent equations. The two values of L are computed, using the estimated Cp, and then compared. The correct Cp and L is determined when either the difference in the two L values falls within an error range or when increasing Cp results in an increase in the error beyond a predetermined amount.

In one embodiment of the present invention, the error range is set at less than 5 percent. However, various error ranges may be used and embodiments of the present invention are not limited to this specific error range. Additionally, Cp may be initially set to a small negative number to ensure that the solution will indeed converge. Likewise, an iteration limit may be included that aborts the solution if it has not converged by a pre-determined maximum number of iterations. Once again, this iteration number can be various numbers and one of the contemplated embodiments sets this value at 19,000. Finally, although embodiments of the present invention include the LabVIEW program, the inventive technique is by no means limited to this program or even to software in general, and may enable any suitable iterative system or technique.

An example of an embodiment of the present invention discussed above was reduced to practice and used to determine the values of Cp and L for two electrical power systems. In the first scenario, the power system was configured so that there was not a significant parasitic capacitance connected in parallel with line impedance measurement system 10. For this scenario, the algorithm calculated a parasitic capacitance of 0.4 µF, where the non-zero calculated value may be attributable to tolerances of the capacitors within the measurement system. The initial Cp value was estimated at −10 µF and the error dropped below 5% within 105 iterations. Most importantly, this example illustrates that embodiments of the present invention can detect when a significant parasitic capacitance is not present because 0.4 µF would be considered a relatively insignificant parasitic capacitance for most applications.

In the second example, a significant parasitic capacitance was included in parallel with line impedance measurement system 10. In this scenario, the algorithm calculated a parasitic capacitance of 94.4 µF and did require more iteration in order to converge. Specifically, the 94.4 µF value was not reached until after 1,000 iterations. Additionally, larger values for Cp (e.g., 100° F.) only increased the error value thereby signally the equations had converged. Most importantly, this example illustrates that if the parasitic capacitance was not determined using the present inventive technique, the short circuit current would have been low by a factor of two. Therefore, this example illustrates that embodiments of the present invention can detect when a parasitic capacitance is present, and further shows one example of the degree of the error that may result when the parasitic capacitance is not properly determined. Moreover, this corrected estimate of the short circuit current is far more desirable than the uncorrected estimate when used for the purpose of determining personal protective equipment.

Figure 4:
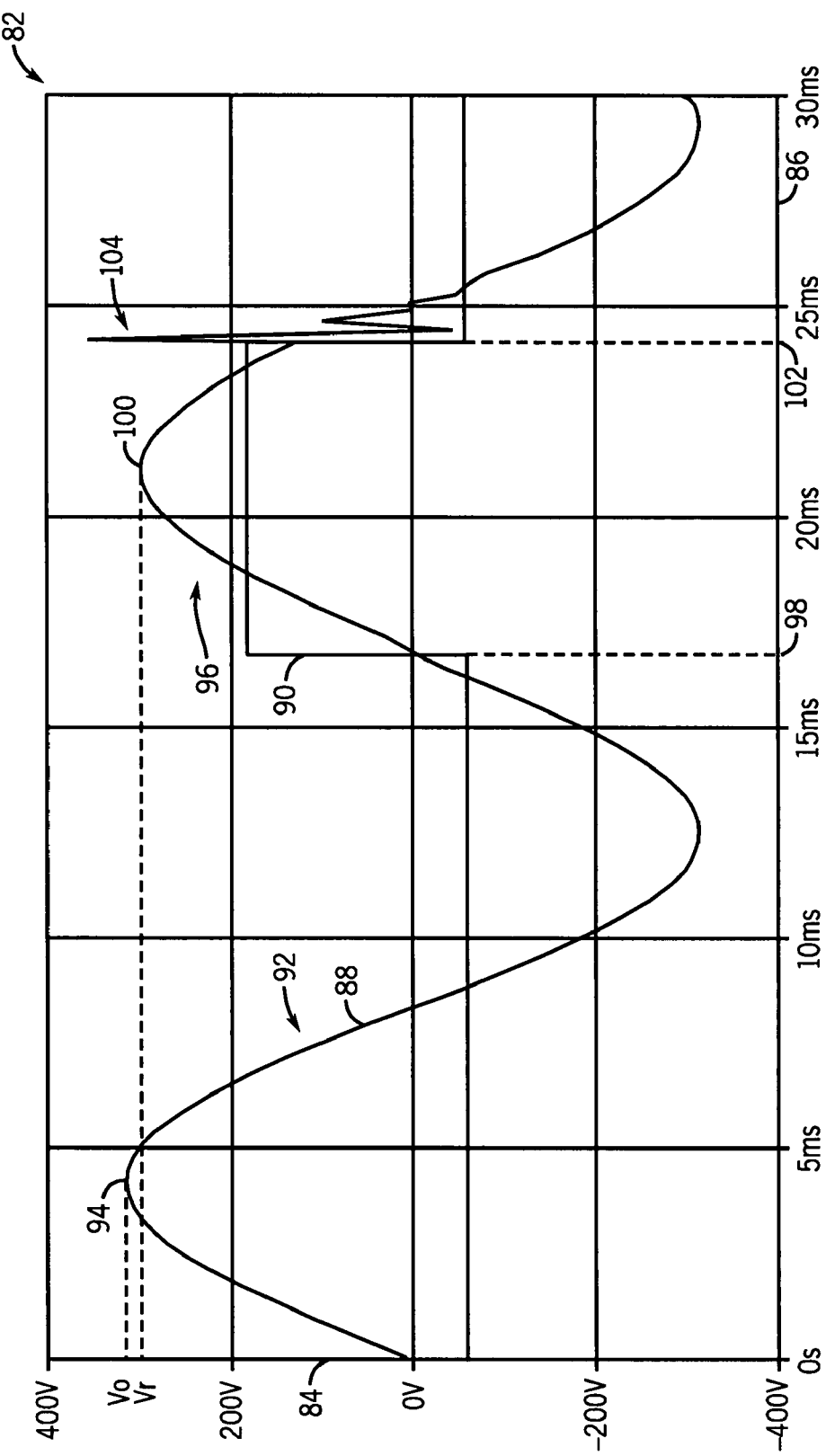
FIG. 4 is an exemplary voltage waveform and a resulting switching waveform generated by implementing the circuitry shown in FIGS. 2A-2C to cause a voltage droop and a resonant ring used to determine impedance parameters.

FIG. 4 illustrates an exemplary AC voltage waveform and a switching waveform for the switch 42 during an exemplary test sequence used to measure values for use in calculating the impedance parameters in accordance with Equations 5 and 8 discussed above. FIG. 4 illustrates the waveforms graphically as indicated generally by reference numeral 82. The voltage waveform or base AC waveform is illustrated graphically with respect to voltage, as indicated axis 84 over time, as indicated by axis 86. The voltage trace 88 of the waveform takes the form of a sine wave. Trace 90 represents the state of switch 42 or, more particularly, the signal applied to drive the gate of the switch to change its conductive state during the testing procedure.

As can be seen from FIG. 4, once sampling of the waveform has begun, samples will be taken continuously at a desired frequency, above the Nyquist rate, to provide reliable data for analysis. In a first cycle 92 of the waveform, with the test circuit open, a peak voltage 94, corresponding to Vo will be detected, among the other values detected and stored. At some point during or preceding a second cycle 96, switch 42 is placed in a conductive state to complete the current carrying path between the line conductors. The change in state of the switch is indicated at the rising edge 90 of the waveform, and occurs at time 98. As a result of the significant voltage drain caused by resistor 36, a sag or droop is detected in the peak 100 of the voltage waveform, with the peak generally corresponding to the value Vr. Subsequently, the switch 42 is opened, as indicated by the drop in waveform 90 that occurs at time 102 indicated in FIG. 4. The opening of switch 42 causes a resonant ring as indicated generally at reference numeral 104. As noted above, the resonant ring may have a peak voltage above the peak voltage of the sinusoidal waveform, and the switch 42 may be selected to accommodate such peaks.

Figure 5:
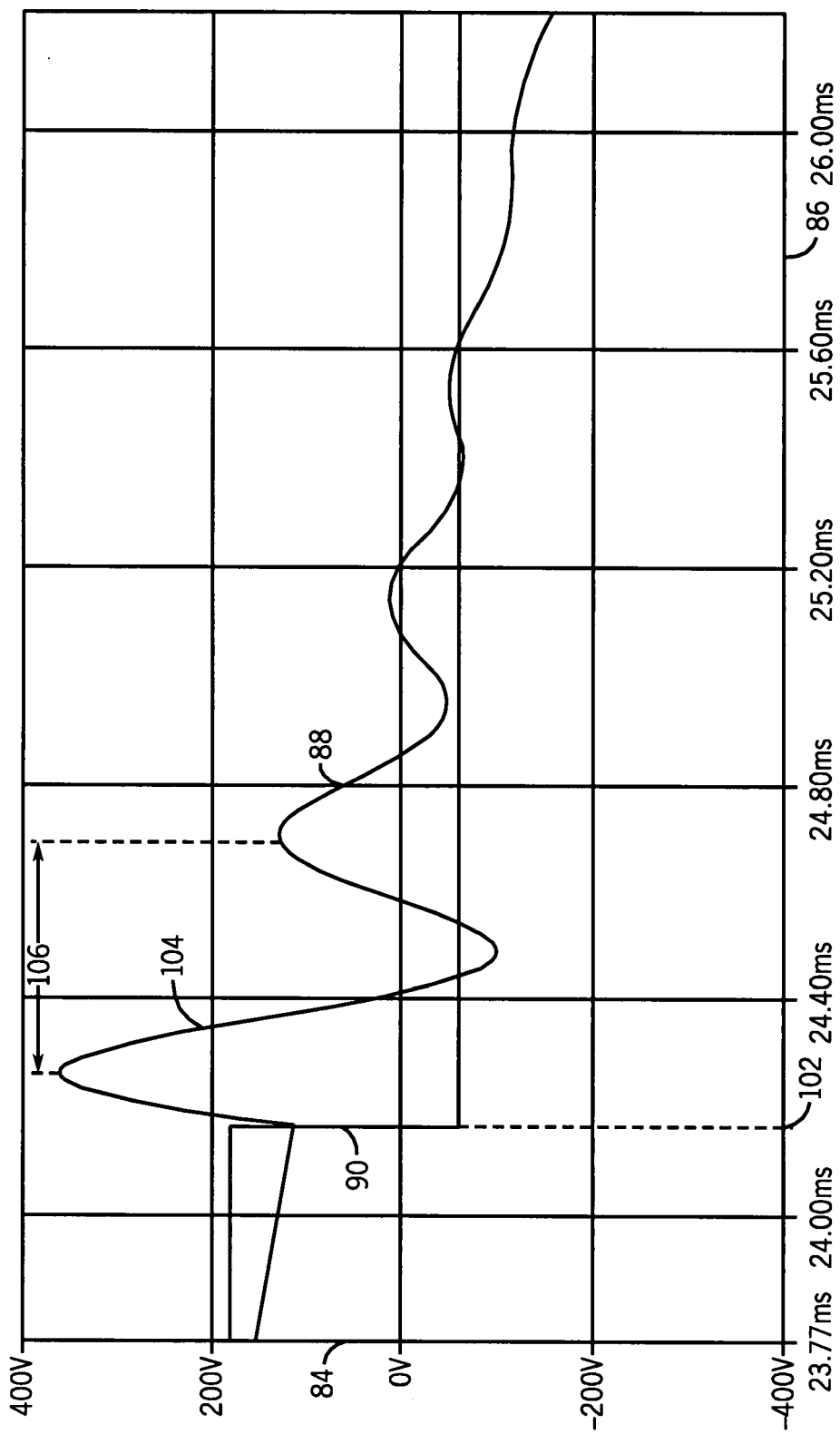
FIG. 5 is a detailed view of an exemplary resonant ring caused in a voltage waveform that may used to determine impedance parameters in accordance with aspects of the present technique.

FIG. 5 illustrates a more detailed view of the resonant ring occurring from opening of the switch of the line test circuitry. Again graphed with respect to a voltage axis 84 and a time axis 86, the ring occurs as the voltage across the lines is decreasing, as indicated by the initial slope of trace 88. The falling edge of waveform 90 represents the removal of the drive signal to the switch causing opening of the circuit. The resulting resonant ring 104 will have a period, or consequently a frequency, that is a function of the circuit component parameters, parasitic capacitance, and of the inductive component of the line impedance. Because the voltage waveform is continuously sampled, the frequency or period may be measured, with a full period being indicated by reference numeral 106 in FIG. 5. As will be apparent to those skilled in the art, the period may be measured in a number of ways, as may the frequency. For example, a half cycle alone may be used to determine the frequency or period, or a full or even more than one cycle may be used. Similarly, in a present embodiment, the values of the ring as sampled by the circuitry may be compared or processed with the naturally declining value of the sinusoidal waveform to provide an accurate indication of the period of the resonant ring.

Further, even though FIG. 5 only illustrates a single ring, the inventive technique generates two resonant rings via the use of two different effective capacitances as discussed with regards to FIGS. 2A-2C. Therefore, FIGS. 4 and 5 are representative of either of the first, second, or additional resonant rings. Additionally, even though the rings may not have the same exact values they will have typically the same general form and may be interrogated to determine the desired parameters (e.g., frequency 106). Thus, based upon the measured voltages, Vo, Vr, and either the period of the first and second resonant ring or their frequency, Equations 5 and 8 may be employed for determining the values of the parasitic capacitance of the system Cp, inductive component of the line impedance, L, and the resistive component of the power line impedance per the process discussed above.

Figure 6:
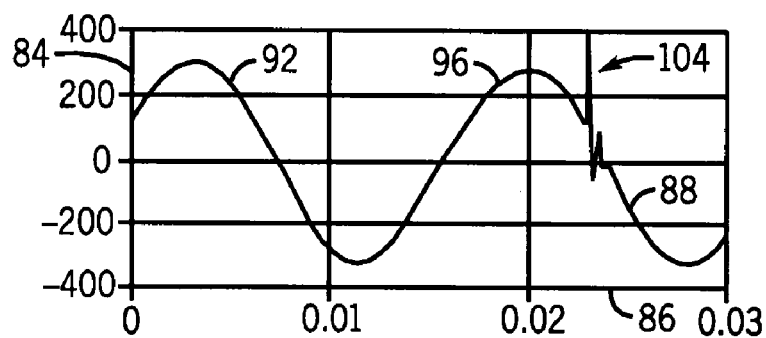
FIG. 6 is graphical representation of a voltage waveform similar to that of FIG. 4, before exemplary filtering of sampled data.
Figure 7:
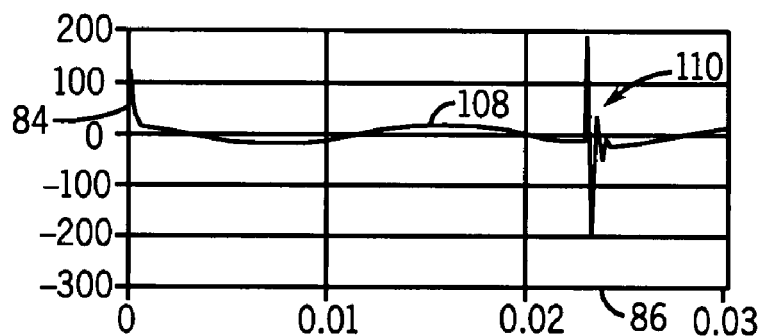
FIG. 7 is a graphical representation of the waveform of FIG. 6 following high pass filtering of sampled data to flatten a portion of the waveform around a resonant ring.
Figure 8:
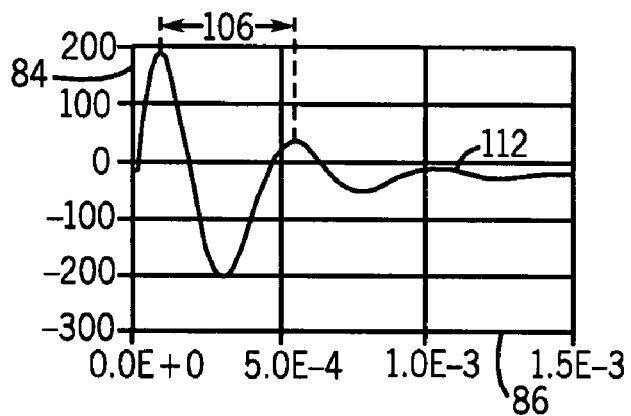
FIG. 8 is a more detailed illustration of the resonant ring visible in FIG. 7 from which measurements can be made for computing impedance parameters.

An alternative approach to identifying the parameters discussed above is illustrated in FIGS. 6-9. As illustrated in FIG. 6, the voltage waveform that is sampled by the voltage measurement circuitry may be illustrated as having successive cycles 92 and 96, with a voltage droop or sag occurring in cycle 96 due to the resistor 36 discussed above. The subsequent ring upon a removal of the short circuit across the power lines is again indicated at reference numeral 104. The data may be high-pass filtered to generally flatten the waveform as indicated at reference numeral 108 in FIG. 7. The high-pass filtered waveform will then exhibit the ring which may be timed to occur during a generally linear portion of the sine wave, as indicated at reference numeral 110 in FIG. 7. From the data, the ring 112 may be extracted as indicated generally in FIG. 8. The period, or half period, or frequency of the ring may then be determined, as indicated at reference numeral 106 in FIG. 8.

Figure 9:
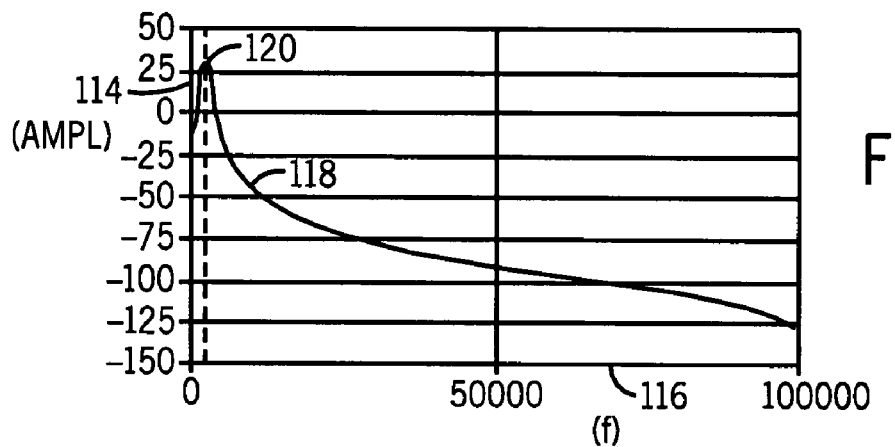
FIG. 9 is a graphical representation of an exemplary frequency domain plot of the ring illustrated in FIG. 8.

Finally, where desired, the waveform may be converted by a one-dimensional fast Fourier transform to a frequency response relationship as indicated in FIG. 9. This frequency response may be represented graphically along an amplitude axis 114 and a frequency axis 116. The frequency trace 118 in FIG. 9 indicates a resonant frequency at peak 120 which generally corresponds to the wavelength measured for the resonant ring as discussed above. As before, this method may be used to determine the resonant frequency for the first, second, or additional resonant rings even though it is only illustrates a single ring.

Once the parasitic capacitance, line inductance, and line resistance is determined the data may be further used with other system and modules to determine critical power line parameters, such as for motor control centers ("MCCs"), switchboards, switchgear, panelboards, pull boxes, junction boxes, cabinets, other electrical enclosures, and distribution components. These parameters may include the incident energy of a potential arc flash in an electrical device, a flash protection boundary, and a personal protective equipment ("PPE") level for a user. Systems that may calculate these parameters and methods for using such systems are disclosed in U.S. Patent Application 2006/0229831, U.S. Patent Application 2006/0229834, and U.S. Patent Application 2006/0241881, the disclosures of which are incorporated herein by reference and in accordance with the measurement method and system disclosed. Moreover, as discussed above, all of the disclosed techniques may be used on single-phase and three-phase applications with little modification. The techniques can also be implemented in permanent (i.e., hard-wired) circuitry, or can be part of portable or even hand-held devices used to determine the incident energy on a periodic or sporadic basis. Still further, the technique may be implemented in a stand-alone embodiment or in a distributed network.

Figure 10:
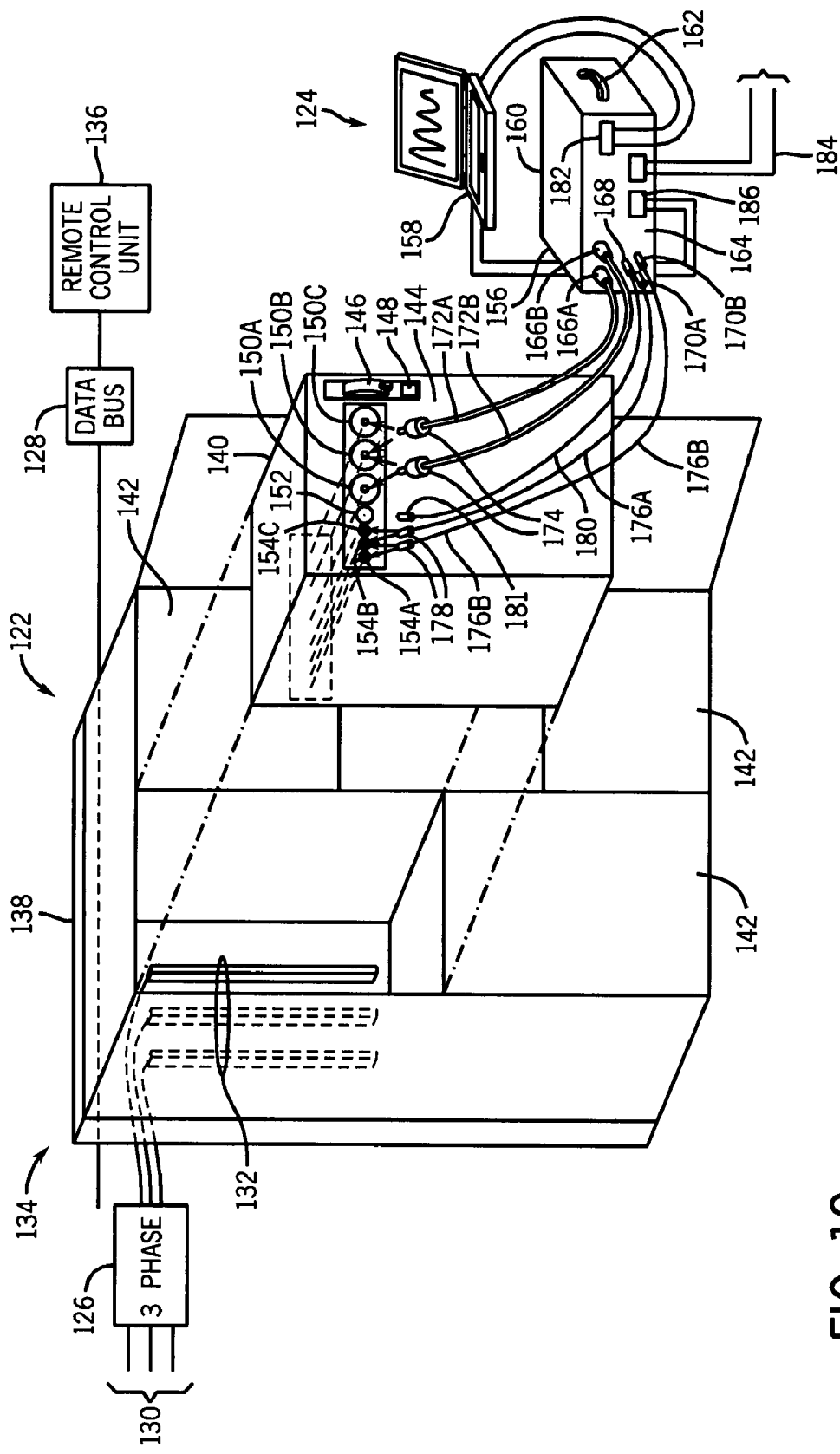
FIG. 10 is a diagrammatical representation of an exemplary motor control center (MCC) on which a portable impedance measurement system in accordance with aspects of the invention is used to determine power line parameters.

FIG. 10 is a diagrammatical representation of an exemplary system 122 employing the portable line impedance measurement system 124. System 122 includes a three phase power bus 126 and a data bus 128. The three phase power bus may be coupled to a power supply grid 130. As illustrated, three phase power bus 126 provides three phase power to bus bars 132 located within a MCC 134. This form of power distribution is well known to those of ordinary skill in the art and need not be described in greater detail. The data bus 128 provides a communication pathway between a remote command and control unit 136 and MCC 134. Those of ordinary skill in the art will appreciate that MCC 134 is exemplary. In alternate embodiments, virtually any type of electrical device or apparatus suitable for use with the portable line impedance measurement system 124 may employ the system in the manner described below.

MCC 134 includes a chassis 138, an available energy analyzer adapter bucket 140, and a plurality of motor control buckets 142. As described above, MCC 134 comprises bus bars 132, which are coupled to the three phase power bus 126.

As will be appreciated by those skilled in the art, in practice, bus bars 132 may be disposed behind one or more plates or barrier.

Energy analyzer adapter bucket 140 includes a front panel 144 having various controls and connection points or interfaces. The controls may include a fuse and breaker switch 146 and a lock out feature 148. Fuse and breaker switch 146 protect electrical components from power surges and also enable an operator to disconnect power from adapter bucket 140 when desired. Lock out feature 148 enables an operator to positively lock the breaker in an open position to ensure the switch 146 is not accidentally tripped while performing maintenance or testing on adapter bucket 140.

Adapter bucket 140 may also include a number of connection points that provide a convenient way for the operator to interface bus bars 132 or other electrical circuit components of MMC 134. These connection points may include high current power connection interfaces 150A, 150B, 150C; a ground connection interface 152; and low current measurement connection interfaces 154A, 154B, 154C. Each pair of the high current and lower current interfaces is coupled to the same respective bus bar or power phase. For example, high current power interface 150A and low current interface 154A are coupled or connected to the first phase of a three phase system, and so on.

In one of the contemplated embodiments of the present invention, portable impedance measurement system 124 may include an analyzer system 156 and a computer 158. Analyzer system 156 may include a case 160 having handles 162 to facilitate transport. Analyzer system 156 may further include a front panel 164 that includes a number of connection points for connecting power and measurement test leads. For example, analyzer system 156 may include high current power connections 166A, 166B, ground connection 168; and low current measurement connection 170A, 170B. Test leads, conductors, or cables that include connectors to interface the adapter bucket 140 may be attached to each of these connection points. These test leads or conductors may include high current conductors or cables 172A, 172B having connectors 174; low current conductors or cables 176A and 176B having connectors 178; and ground cable or conductor 180 having connector 181.

Analyzer system 156 may also comprise a communication interface 182 for connecting the analyzer system 156 to computer system 158. Communication interface 182 may employ any communication protocol suitable for communication between analyzer system 156 and computer 158. For example, computer interface 182 may include a number of different communication methods such as a USB port, a Firewire port, an Ethernet port, a Bluetooth transmitter and receiver, an 802.11 transmitter and receiver, and so forth. Further, analyzer system 156 may include a power outlet 184 for powering the analyzer system that may further provide power for computer 158 via a computer power interface 186. Thus, communication interface 182 and power interface 186 facilitate establishing a data communications link between analyzer system 156 and computer 158. However, it should be noted that data analyzer system 156 may include all of the necessary elements for executing the inventive technique within a single unit and thus may not require establishing a data communications link with an external computer. Additionally, while not illustrated in the figure, available energy analyzer adapter bucket 140 may also include a display, memory, and a network interface. Finally, analyzer system may include an internal power supply or battery to provide power to portable line impedance measurement system 124.

As discussed above, portable line impedance measurement system 124 includes a voltage perturbation circuit. The voltage perturbation circuit may be defined to include resistor 36, capacitor 38, capacitor 40, solid state switch 42, second switch 44, switch 48, and driver circuitry 54 (see FIGS. 2A-2C). Those of ordinary skill in the art will appreciate that there is an intrinsic resistance in the connection between the voltage perturbation circuit and bus bars 132. This intrinsic resistance can affect the accuracy of voltage measurement circuitry 50 (see FIGS. 2A-2B). To reduce the effects of this intrinsic resistance, voltage measurement circuitry 50 may be coupled to low current interfaces 154A, 154B, 154C while the voltage perturbation circuitry 26 may be coupled high current interfaces 150A, 150B, and 150C. Those of ordinary skill in the art will appreciate that coupling the voltage measurement circuitry 50 to a different set of stabs than the voltage perturbation circuitry increases the accuracy of the measurement of the voltage measurement circuit 50. That is, due to the significant current draw of the voltage perturbation circuitry, voltages that would be measured at that circuit could be significantly affected by the resistance of that circuit's stabs, fuses, and so forth. On the other hand, the current draw of the voltage measurement circuitry 50 is negligible. The parallel connection of the two circuits, then, allows for more accurate measurements of the voltages during tests.

Additionally, one embodiment of the present invention provides only two conductors or cables for low current interfaces 154A, 154B, 154C and high current interfaces 150A, 150B, and 150C. Thus, the process of measuring the line impedance is done separately for each phase of a three phase system 126. For example, the user first connects high current conductors 172A, 172B to high current interface 150A, 150B and low current conductors 176A, 176B to low current interface 154A, 154B, where each of the respective high current interfaces and low current interfaces are coupled to the same phase of the three phase system.

Once connected to the respective phase, the operator performs the inventive technique to measure the line impedance for that particular phase and then disconnects both the high and low current conductors. The operator may then connect the conductors across the next phase and repeats the process until the voltage parameters for each phase has been determined. In sum, one embodiment of the present invention requires the operator to physically move the low and high current conductors between the respective phases in order to measure the line impedance for each phase of a three phase system.

Figure 11:
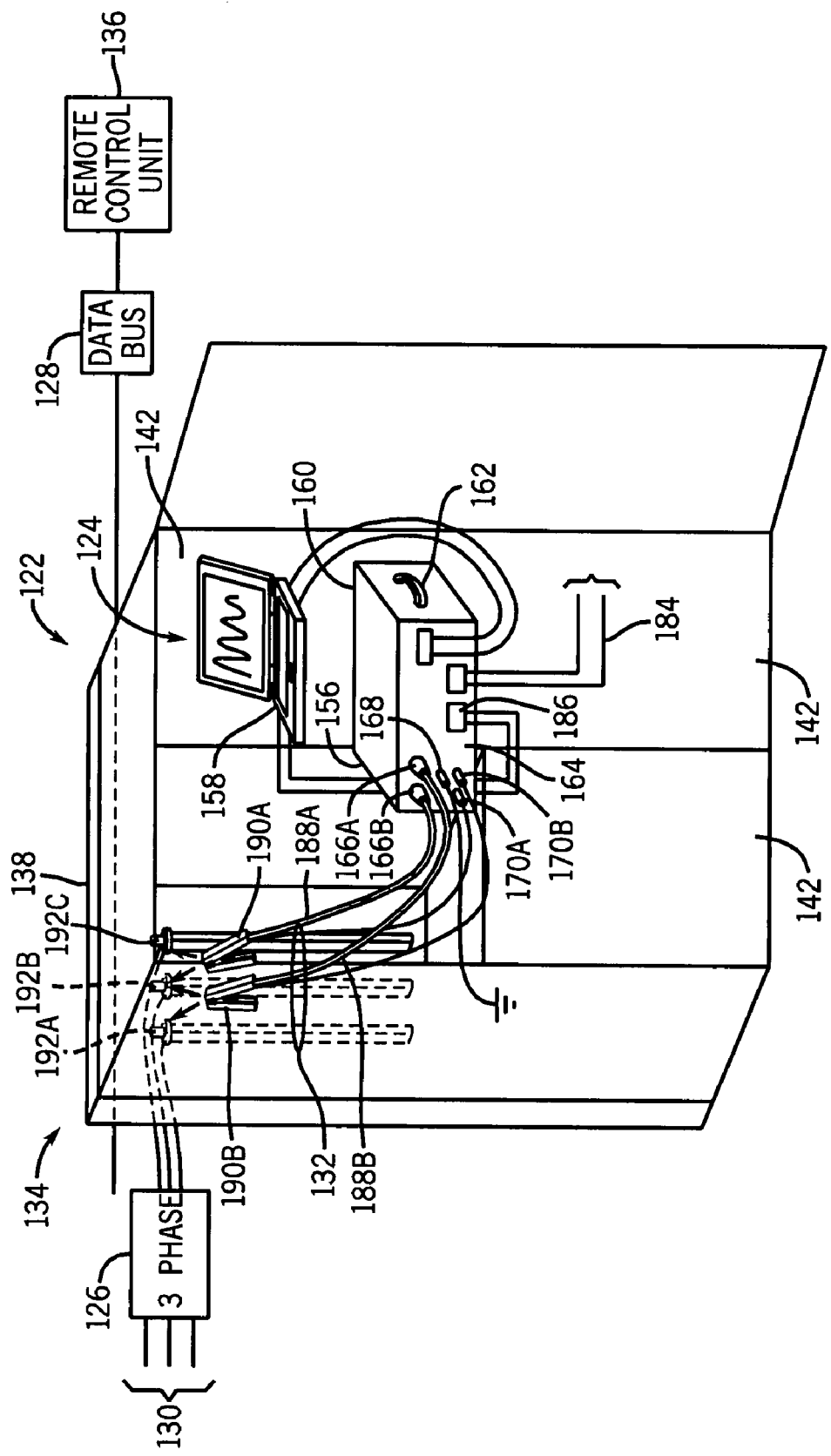
FIG. 11 is a diagrammatical representation of an alternate exemplary MCC employing a portable impedance measurement system in accordance with aspects of the invention.

FIG. 11 is a diagrammatical representation of an alternate exemplary system 122 employing the portable line impedance measurement system 124. For simplicity, like reference numerals have been used to designate features previously described in reference to FIG. 10. In this embodiment, MCC 134 does not include available energy analyzer adapter bucket 140 (see FIG. 10) for interfacing bus bars 132. Instead, bus bars 132 are interfaced directly via special test leads connected to portable line impedance measurement system 124. In one embodiment of the present invention, the test leads or conductors include a two wire connector or conductor 188A, 188B that terminate at clamp 190A, 190B, respectively. Each two wire conductor 188A, 188B includes a high current conductor and lower current conductor coupled to the analyzer system 156 at the respective connection points discussed above.

Each clamp 190A, 190B is then connected directly to the bus bars at power line interface or connection points 192A, 192B, 192C. These connection points facilitate connecting the test leads to the three phase power system and enable coupling the line impedance measurement system 126 to an MCC that may not include available energy analyzer adapter bucket 140. As before, this particular embodiment of the present invention requires the operator to physically move the low and high current conductors between the respective phases in order to measure the line impedance for each phase of a three phase system. Additionally, in alternate embodiments, the test leads may include any form of connector suitable for connecting the test leads to a power source or three phase power bus 132.

Figure 12:
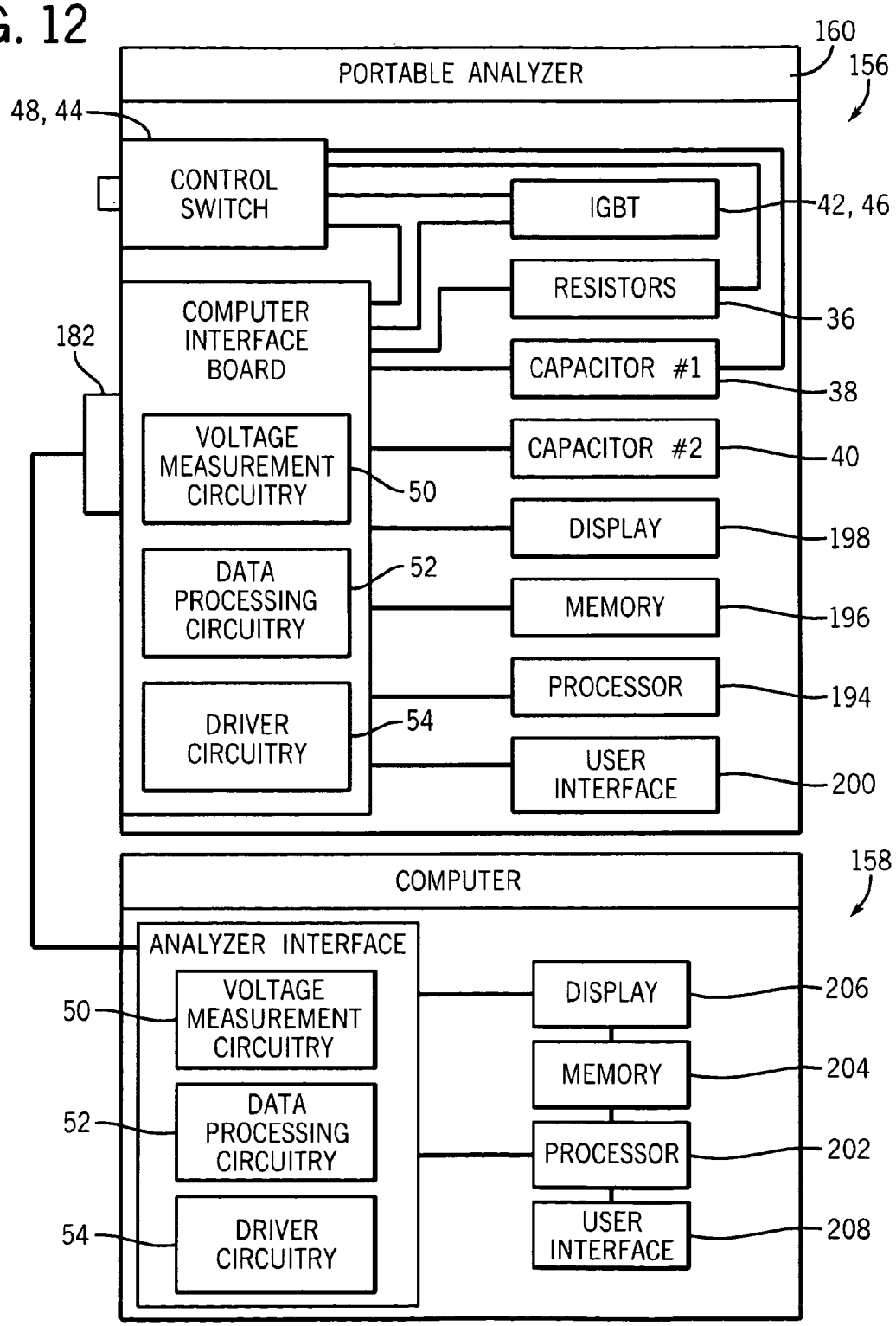
FIG. 12 is a block diagram illustrating one embodiment of a portable impedance measurement system that includes a portable analyzer and a computer.

FIG. 12 is a block diagram illustrating one embodiment of a portable line impedance measurement system 124 that includes a portable analyzer 156 and a computer 158. Portable analyzer 156 may include a number of the elements discussed above in a single case 160. For example, portable analyzer 56 may include voltage measurement circuitry 50; data processing circuitry 52; driver circuitry 54; control switch 44, 48; IGBT 42, 46; capacitors 38, 40; and resistor 36.

Additionally, embodiments of portable analyzer 156 may include a processor 194, memory 196, a display 198, and a user interface 200 within single unit or case 160. For these embodiments, establishing a data communication link to computer 158 may not be necessary because the portable analyzer includes all of the elements necessary to generate a first and second resonant ring in an AC waveform and compute the line impedance based on the frequencies of the rings. However, for some embodiments it is desirable to establish a communications link with computer 158 via a computer interface board and communication interface 182.

In one embodiment, computer 158 comprises a laptop, tablet, or a portable computer system. In another embodiment, computer 158 comprises a personal digital assistant or palm-top computer system. For these embodiments and others, computer 158 may include the common elements of a processor 202, memory 204, display 206, and user interface 208. Display 206 may be a liquid crystal diode (LCD) display or VGA monitor. User interface 208 may be an internal keyboard, an external keyboard, or a touch screen. In one embodiment, the display 206 and user interface 208 may include a single touch screen. Additionally, memory 204 may include internal memory or external memory. Internal memory may include RAM, ROM, PROM, EPROM, EEPROM, FLASH, DRAM or any other volatile or nonvolatile memory. External memory may include an ATA Flash memory card, a SD memory card, or other suitable removable memory. Both internal memory and external memory may vary in capacity depending on the application. Further, the flexibility of external memory enables the capacity of the memory to be tailored to the specific application.

Computer 158 may also include voltage measurement circuitry 50, data processing circuitry 52, and driver circuitry 54 for embodiments where analyzer system 156 does not include this circuitry and is limited to only the voltage perturbation circuit (i.e., IGBT, resistors, capacitors, switches). Additionally, computer 158 may be used to process the first and second resonant rings generated by analyzer 156, and may be further used to compute the line impedance based on the frequencies of the rings. Alternatively, computer 158 may simply provide a program used to simultaneously solve the equations discussed above, while omitting voltage measurement circuitry 50 and/or driver circuitry 54.

Figure 13:
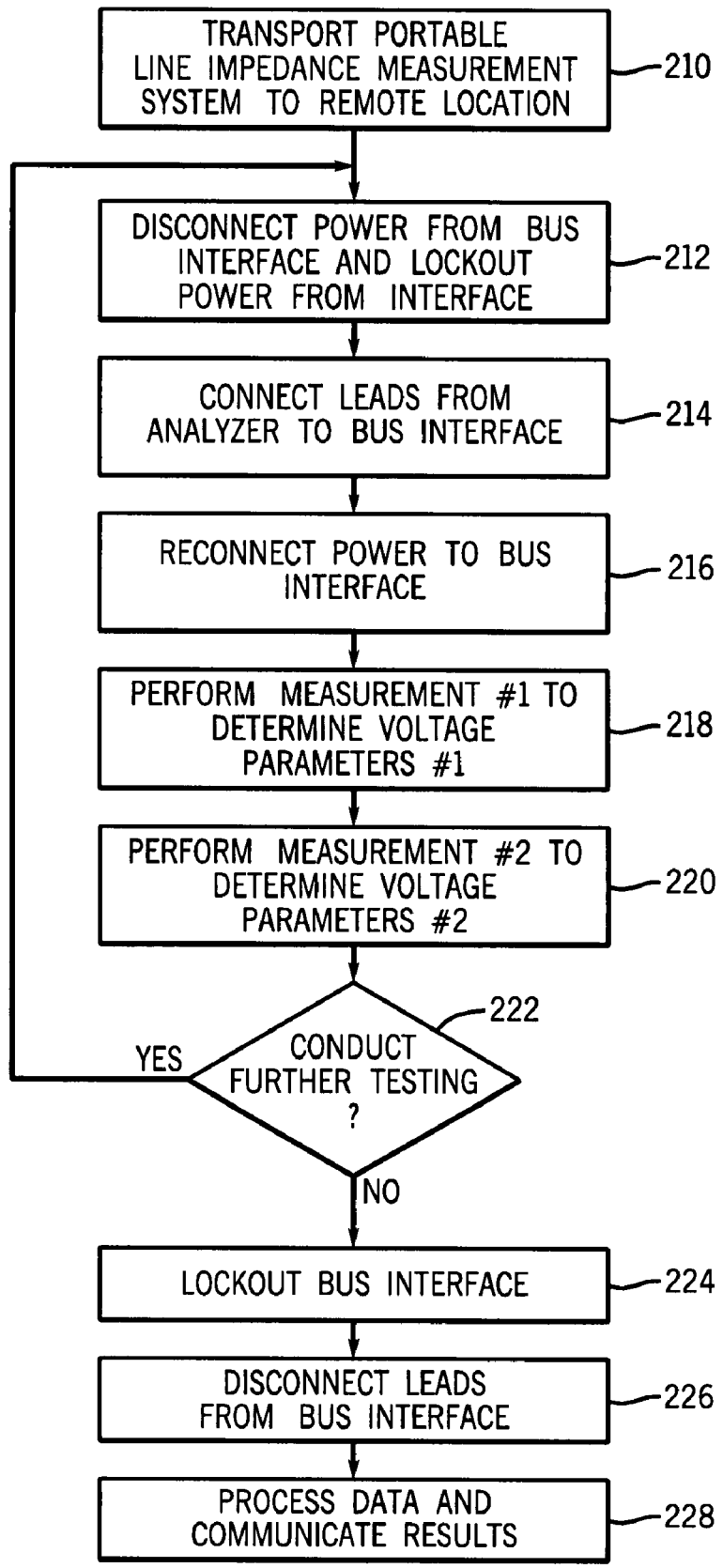
FIG. 13 is a flow chart illustrating a method of using a portable impedance measurement system to determine the power line impedance.

FIG. 13 a flow chart illustrating one method of using portable line impedance measurement system 124 to determine the power line impedance of a power system. The process is initiated by transporting the portable line impedance measurement system to the remote location (block 210). This step includes establishing communications between the portable analyzer and the computer if the system 124 is not contained within one unit. As discussed above, this communication may be a wired connection or a wireless connection and may take the form of any suitable link between such devices.

Next, the operator lock outs the bus interface (block 212) and connects the test lead from the analyzer to the bus interface (block 214). As discussed above, embodiments of the present invention include two leads, but the inventive technique is not limited to two leads and may employ three or more test leads. Power is then reconnected to the bus interface (block 216) and the operator or system initiates the process and acquires first voltage parameters (block 218). After the first measurement is complete, the system or operator initiates the process to acquire second voltage parameters (block 220). The initiation of each measurement process may be performed by the operator or may be automated and performed by the analyzer system 156 or computer 158.

In the scenario where the operator has to reconnect the leads to another phase of a three phase system, the operator may repeat the previous steps (blocks 212-220). As discussed above, this may require moving the test leads between the bus bars to include a combination that has not been previously tested. Once all of the phase have been tested, the operator may then lockout the bus interface (block 224) and disconnect the test leads of the analyzer from the bus interface (block 226). The operator may then process the data and communicate the desired results (block 228). Additionally, the operator may also conduct pre-processing or full processing of the data during each phase measurement as desired. Similarly, the processed data may be transmitted to an application computer for further processing or stored for maintenance records. In summary, there is a plethora of data and information that can be accessed and analyzed by the operator via the portable analyzer 156 and/or computer 158. By no means is the application limited to the method or the specific data discussed above.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A portable system for determining power line impedance, comprising:
   a set of test leads to be coupled to a power line interface;
   an impedance measurement system coupled to the set of test leads and comprising circuitry to generate a first resonant ring and a second resonant ring in an AC waveform, to measure frequencies or periods of the first and second resonant rings, and compute an impedance based on the frequencies or periods of the resonant rings;
   the impedance measurement system comprising
      a case that includes a resistor to be coupled to the power line interface,
      a first capacitor,
      a first switch for placing the resistor in a short circuit with the power line interface and for interrupting the short circuit to cause the first resonant ring between the first capacitor and an inductive and capacitive component of the power line impedance,
      a second capacitor, and
      a second switch for coupling a second capacitor to the first capacitor and the resistor to cause the second resonant ring between the first and second capacitors and the inductive and capacitive components of the power line impedance;
      measurement circuitry for measuring voltages during a test sequence in which the switches are switched on and off;
      processing circuitry for determining inductive and capacitive components of power line impedance based upon the measured voltages; and
      a display coupled to the impedance measurement system to communicate the computed impedance.

2. The portable system of claim 1, comprising a power line interface that includes an adapter comprising at least one low current measurement connection, a ground connection, and at least one high current power connection.

3. The portable system of claim 1, wherein the set of test leads include two low current conductors, a ground conductor, and two high current power conductors.

4. The portable system of claim 1, comprising a power line interface that includes at least one bus bar and a ground.

5. The portable system of claim 1, wherein the set of test leads includes a ground conductor and a pair of two wire connectors, each two wire connector comprising two high current conductors terminating at a clamp used to couple to a power line interface.

6. The portable system of claim 1, wherein the impedance measurement system comprises an analyzer system coupled to a computer and the set of test leads.

7. The portable system of claim 6, wherein the computer includes a processor, driver circuitry, voltage measurement circuitry, data processing circuitry, or a combination thereof.

8. The portable system of claim 6, wherein the analyzer system includes a processor, driver circuitry, voltage measurement circuitry, data processing circuitry, or a combination thereof.

9. The portable system of claim 1, wherein the impedance measurement system includes a processor, a display, memory, a user interface, driver circuitry, voltage measurement circuitry, data processing circuitry, or a combination thereof.

10. A method for determining power line impedance, comprising:
   connecting a set of test leads between a portable impedance measurement system and a power line interface of a power system;
   using the portable impedance measurement system to perform the steps of:
   measuring a base voltage of an AC waveform applied to an electrical line;
   draining current from the line and measuring a first droop voltage of the AC waveform during a droop in voltage resulting from the current drain;
   removing the current drain to cause a first resonant ring in the voltage in the line;
   measuring a parameter of the first resonant ring;
   subsequently draining current from the line and measuring a second droop voltage of the AC waveform during a droop in voltage resulting from the subsequent current drain;
   removing the subsequent current drain to cause a second resonant ring in the voltage in the line, the second resonant ring being different from the first resonant ring;
   measuring a parameter of the second resonant ring;
   computing the line impedance based upon the measured voltages and the measured parameters; and
   communicating the line impedance wherein communicating the line impedance includes displaying the line impedance via a display coupled to the portable impedance measurement system.

11. The method of claim 10, wherein using the portable impedance system includes placing a first effective capacitance between the line and a different electrical potential, wherein the period or frequency of the first resonant ring is a function of the first effective capacitance and inductive and parasitic components of the line impedance, and placing a second effective capacitance between the line and the different electrical potential, wherein the period or frequency of the second resonant ring is a function of the second effective capacitance and the inductive and parasitic components of the line impedance.

12. The method of claim 10, wherein connecting a set of test leads to the power line interface includes connecting a ground cable to a ground connector of the power system, connecting two low current cables to two lower current measurement connectors of the power system, and connecting two high current cables to two high current power connectors of the power system.

13. The method of claim 10, wherein computing the line impedance includes linking a computer processor in data communications with the portable impedance measurement system for receiving and processing the measured voltages and resonant rings.

14. A method for determining power line impedance, comprising:
  connecting a portable impedance measurement system to a power line via a set of conductors;
  sampling power line voltage with and without a resistor in short circuit with the power line;
  causing a first resonant LC ring in the power line voltage and sampling power line voltage during the first resonant ring;
  identifying a parameter of the first resonant LC ring;
  causing a second resonant LC ring in the power line voltage and sampling power line voltage during the second resonant ring;
  identifying a parameter of the second resonant LC ring;
  computing a component of the line impedance based upon the measured voltages and the parameter of the first and second resonant LC ring; and
  communicating the component of the line impedance, wherein communicating the component of the line impedance includes displaying the line impedance via a display coupled to the portable impedance measurement system.

* * * * *